United States Patent
Pell et al.

(10) Patent No.: US 6,801,562 B2
(45) Date of Patent: Oct. 5, 2004

(54) HIGH REPETITION RATE EXCIMER LASER SYSTEM

(75) Inventors: Michael A. Pell, Fountainebleau (FR); Charlene M. Smith, Corning, NY (US); Robert W. Sparrow, Sturbridge, MA (US); Paul M. Then, Corning, NY (US)

(73) Assignee: Corning Incorporated, Corning, NY (US)

(*) Notice: Subject to any disclaimer, the term of this patent is extended or adjusted under 35 U.S.C. 154(b) by 0 days.

(21) Appl. No.: 10/087,485

(22) Filed: Mar. 1, 2002

(65) Prior Publication Data

US 2003/0007536 A1 Jan. 9, 2003

Related U.S. Application Data

(60) Provisional application No. 60/272,814, filed on Mar. 2, 2001, and provisional application No. 60/356,987, filed on Feb. 13, 2002.

(51) Int. Cl.[7] .................................................. H01S 3/22
(52) U.S. Cl. ...................... 372/57; 372/29.01; 372/32
(58) Field of Search ............................... 372/29.01, 32, 372/55, 57, 108, 56; 430/5; 356/432

(56) References Cited

U.S. PATENT DOCUMENTS

| | | | | |
|---|---|---|---|---|
| 6,242,136 B1 | * | 6/2001 | Moore et al. ................. | 430/5 |
| 6,345,065 B1 | * | 2/2002 | Kleinschmidt et al. ....... | 372/57 |
| 6,421,365 B1 | * | 7/2002 | Kleinschmidt et al. ....... | 372/108 |
| 6,492,072 B2 | * | 12/2002 | Moore et al. ................. | 430/5 |
| 6,560,254 B2 | * | 5/2003 | Stamm ........................ | 372/32 |
| 6,567,450 B2 | * | 5/2003 | Myers et al. ................. | 372/57 |
| 2001/0043331 A1 | * | 11/2001 | Rebhan ....................... | 356/432 |
| 2002/0044586 A1 | * | 4/2002 | Myers et al. ................. | 372/57 |
| 2002/0071469 A1 | * | 6/2002 | Kakizaki et al. ............. | 372/57 |
| 2002/0105994 A1 | * | 8/2002 | Partlo et al. ................. | 372/57 |
| 2002/0122450 A1 | * | 9/2002 | Sparrow ...................... | 372/57 |
| 2002/0122451 A1 | * | 9/2002 | Sparrow ...................... | 372/57 |
| 2002/0154671 A1 | * | 10/2002 | Knowles et al. ............. | 372/57 |

FOREIGN PATENT DOCUMENTS

RU         2041298 C1         8/1995

* cited by examiner

*Primary Examiner*—James Vannucci
*Assistant Examiner*—Jimmy T. Vu
(74) *Attorney, Agent, or Firm*—Walter M. Douglas

(57) ABSTRACT

The invention provides a ≧4 kHz repetition rate argon fluoride excimer laser system for producing an UV wavelength 193 nm output. The ≧4 kHz repetition rate argon fluoride excimer laser system includes an argon fluoride excimer laser chamber for producing a 193 nm discharge at a pulse repetition rate ≧4 kHz. The ≧4 kHz repetition rate argon fluoride excimer laser chamber includes magnesium fluoride crystal optic windows for outputting the 193 nm discharge as a ≧4 kHz repetition rate excimer laser 193 nm output with the magnesium fluoride crystal optic windows having a 255 nm induced absorption less than 0.08 Abs/42 mm when exposed to 5 million pulses of 193 nm light a fluence ≧40 mj/cm$^2$/pulse and a 42 mm crystal 120 nm transmission of at least 30%.

13 Claims, 8 Drawing Sheets

FIG. 4  MgF2 Sample A Unexposed vs Exp 4.5E6 @ 193nm F(avg):40mj/cm^2, Path: 42mm FIG. 5 MgF2 Sample B Unexposed vs Exp 4.6E6 @ 193nm F(avg): 40mj/cm^2, Path: 42mm FIG. 6  MgF2 Sample C Unexposed vs Exp 4.6E6 @ 193nm F(avg): 40mj/cm^2, Path: 42mm FIG. 7  MgF2 Sample D Unexposed vs Exp 4.6E6 @ 193nm F(avg): 40mj/cm^2, Path: 42mm

HIGH REPETITION RATE EXCIMER LASER SYSTEM

RELATED APPLICATIONS

This application claims the benefit of, and incorporates by reference, U.S. Provisional Application, (Ser. No. 60/356,987), filed Feb. 13, 2002 entitled HIGH REPETITION RATE EXCIMER LASER SYSTEM, by M. Pell, C. M. Smith, R. W. Sparrow and P. M. Then.

It also claims the benefit of, and incorporates by reference, U.S. Provisional Application Ser. No. 60/272,814, filed Mar. 2, 2001 entitled HIGH REPETITION RATE UV EXCIMER LASER MAGNESIUM FLUORIDE OPTICS, by R. W. Sparrow. It also claims benefit of U.S. Provisional No. 60/356,987 filed Feb. 13, 2002.

It also claims the benefit of, and incorporates by reference, co-filed U. S. Non-Provisional Application, entitled METHOD OF MAKING HIGH REPETITION RATE EXCIMER LASER CRYSTAL OPTICS AND UV<200NM TRANSMITTING OPTICAL FLUORIDE CRYSTAL, by S. L. Gray, M. Pell, C. M. Smith, R. W. Sparrow and P. M. Then.

SUMMARY OF THE INVENTION

The invention includes a high repetition rate (repetition rate $\geq 4$ kHz) fluoride excimer laser with magnesium fluoride laser optics for transmitting and controlling the UV $\lambda$ photons produced by the laser. The magnesium fluoride high repetition rate UV excimer laser optics provide for improved reliability in the operation of $\geq 4$ kHz high repetition rate laser systems. The magnesium fluoride containing high repetition rate laser provides for the production of a high laser power ($\geq 10$ mJ) output at a high repetition rate ($\geq 4$ kHz) for a long laser system operation time (>500 million pulses, preferably $\geq 900$ million pulses) with a magnesium fluoride laser optics reliability that avoids catastrophic damage of the laser optics and related catastrophic laser system failure. In a preferred embodiment the magnesium fluoride laser optics are utilized in a UV $\lambda$<200 nm ArF excimer laser with a 4 kHz repetition rate and an output power of 10 mJ.

The manufacture of semiconductor chips can be achieved using excimer lasers as a light source. Krypton Fluoride lasers with a wavelength of ~248 nm were the first excimer lasers to be used. As the semi-conductor chip technology has evolved, lasers of higher energy and higher repetition rate are required. One such excimer laser is known as Argon Fluoride emitting at ~193 nm. For various applications it is preferable to have such a laser with a repetition rate of 4 kHz. In both Krypton Fluoride lasers and Argon Fluoride lasers, the preferred optical material for windows, beamsplitters, output couplers and line narrowing prisms has been calcium fluoride. At high repetition rates such as 4 kHz it has been observed that the calcium fluoride chamber windows suffer catastrophic damage in a relatively short time scale [less than 500 million pulses for a 4 kHz, 193 nm ArF laser with an output power of 10 mJ.] The damage to the window can be as severe as cracking but at a minimum results in wavefront distortion and increased birefringence. Changing of the windows results in an increased cost of operation of the laser and therefore increased cost of ownership for the chip manufacturer.

Calcium fluoride is a cubic material, optically isotropic with excellent transmission in the VUV, UV, visible and IR parts of the spectrum. When calcium fluoride is illuminated with 193 nm laser light, the material emits photons in the near UV. The observed fluorescence in turn means energy is being absorbed. As the band gap of calcium fluoride is much larger than the energy of the laser photons it is surmised that there is a multi-photon absorption process. It is proposed that the center created by multi-photon absorption can itself absorb further photons and this can lead to heating and consequently material degradation. If the lifetime of the absorption center is sufficiently long then at 4 kHz heating can occur whereas at lower repetition rates, heating may not be observed.

Magnesium fluoride is a tetragonal material and therefore optically anisotropic. As such it has not been a favored material for lithographic lasers because of the importance of polarization within the manufacturing process. Magnesium fluoride has a wider bandgap and a lower quench temperature for self trapped excitonic emission.

The invention includes a $\geq 4$ kHz repetition rate argon fluoride excimer laser system for producing an UV wavelength 193 nm output. The $\geq 4$ kHz repetition rate argon fluoride excimer laser system includes an argon fluoride excimer laser chamber for producing a 193 nm discharge at a pulse repetition rate $\geq 4$ kHz. The $\geq 4$ kHz repetition rate argon fluoride excimer laser chamber includes at least one magnesium fluoride crystal optic window for outputting the 193 nm discharge as a 4 kHz repetition rate excimer laser 193 nm output with the magnesium fluoride crystal optic window having a 255 nm induced absorption less than 0.08 Abs/42 mm when exposed to 5 million pulses of 193 nm light at a fluence $\geq 40$ mj/cm$^2$/pulse and a 42 mm crystal 120 nm transmission of at least 30%. That is, the invention includes a $\geq 4$ kHz repetition rate argon fluoride excimer laser system in which the laser chamber has at least one window made from a single crystal of magnesium fluoride, and such window, after exposure to 5 million pulses of 193 nm light having a fluence of 40 mJ/cm$^2$/pulse, has an absorbance of less than 0.08 Abs per 42 mm path length when measured at 255 nm and a 120 nm transmission of at least 30% through a 42 mm path.

The invention includes a $\geq 4$ kHz repetition rate excimer laser system for producing an UV wavelength $\lambda$<200 nm output. The $\geq 4$ kHz repetition rate excimer laser system for producing an UV wavelength $\lambda$<200 nm output includes an excimer laser chamber for producing an UV wavelength $\lambda$<200 nm discharge at a pulse repetition rate $\geq 4$ kHz. The excimer laser chamber includes at least one magnesium fluoride crystal optic window for outputting the $\lambda$<200 nm discharge as a $\geq 4$ kHz repetition rate excimer laser $\lambda$<200 nm output with the magnesium fluoride crystal optic window having a 255 nm induced absorption less than 0.08 Abs/42 mm when exposed to 5 million pulses of 193 nm light at a fluence $\geq 40$ mj/cm$^2$/pulse and a 42 mm crystal 120 nm transmission of at least 30% and a 200 to 210 nm range absorption coefficient <0.0017 cm$^{-1}$.

The invention includes a $\geq 4$ kHz repetition rate fluoride excimer laser magnesium fluoride crystal optic for transmitting a $\geq 4$ kHz repetition rate fluoride excimer UV wavelength $\lambda$<200 nm output. The $\geq 4$ kHz repetition rate fluoride excimer laser magnesium fluoride crystal has a 255 nm induced absorption less than 0.08 Abs/42 mm when exposed to 5 million pulses of 193 nm light at a fluence $\geq 40$ mj/cm$^2$/pulse and a 42 mm crystal 120 nm transmission of at least 30%.

The invention includes a $\geq 4$ kHz repetition rate fluoride excimer laser magnesium fluoride crystal optic window for transmitting a $\geq 4$ kHz repetition rate fluoride excimer UV wavelength $\lambda$<200 nm output. The $\geq 4$ kHz repetition rate fluoride excimer laser crystal optic window is comprised of a magnesium fluoride crystal with a 255 nm induced absorption less than 0.08 Abs/42 mm when exposed to 5 million pulses of 193 nm light at a fluence ≧40 mj/cm²/pulse and a 42 mm crystal 120 nm transmission of at least 30% and a 200 to 210 nm range absorption coefficient <0.0017 cm⁻¹.

The invention includes a ≧4 kHz repetition rate argon fluoride excimer laser crystal optic for transmitting an UV wavelength 193 nm argon fluoride excimer laser ≧4 kHz repetition rate output with the laser crystal optic comprised of a magnesium fluoride crystal with a 255 nm induced absorption less than 0.08 Abs/42 mm when exposed to 5 million pulses of 193 nm light at a fluence >40 mj/cm²/pulse and a 42 mm crystal 120 nm transmission of at least 30%.

The invention includes a λ<200 nm optical fluoride crystal for transmitting a UV wavelength λ<200 nm with the λ<200 nm optical fluoride crystal comprised of a magnesium fluoride crystal with a 255 nm induced absorption less than 0.08 Abs/42 mm when exposed to 5 million pulses of 193 nm light at a fluence ≧40 mj/cm²/pulse and a 42 mm crystal 120 nm transmission of at least 30%, and a Fe contamination level less than 0.17 ppm Fe by weight, a chrome contamination level less than 00.08 ppm chrome by weight, a copper contamination level less than 0.04 ppm copper by weight, a cobalt contamination level less than 0.04 ppm cobalt by weight, an Al contamination level less than 0.9 ppm Al by weight, a nickel contamination level less than 0.04 ppm nickel by weight, a vanadium contamination level less than 0.04 ppm vanadium by weight, and a lead contamination level less than 0.04 ppm lead by weight and a 200 to 210 nm range absorption coefficient <0.0017 cm⁻¹. Preferably the Fe contamination level is less than 0.15 ppm Fe by weight, the chrome contamination level is less than 0.06 ppm chrome by weight, the copper contamination level is less than 0.02 ppm copper by weight, the cobalt contamination level is less than 0.02 ppm cobalt by weight, the Al contamination level is less than 0.7 ppm Al by weight, the nickel contamination level is less than 0.02 ppm nickel by weight, the vanadium contamination level is less than 0.02 ppm vanadium by weight, and the lead contamination level is lass than 0.02 ppm lead by weight. That is the invention includes an optical fluoride crystal comprised of a magnesium fluoride crystal that when exposed to 5 million pulses of 193 nm light at a fluence ≧40 mj/cm²/pulse has an induced absorption of less than 0.08 Abs per 42 mm path, and a 120 nm transmission of at least 30% through a 42 mm crystal; and contaminants at levels as specified above in this paragraph.

The invention includes a ≧4 kHz repetition rate argon fluoride excimer laser crystal for transmitting an UV wavelength 193 nm argon fluoride excimer laser ≧4 kHz repetition rate output with the laser crystal comprised a magnesium fluoride crystal with a 255 nm induced absorption less than 0.08 Abs/42 mm when exposed to 5 million pulses of 193 nm light at a fluence ≧40 mj/cm²/pulse and a 42 mm crystal 120 nm transmission of at least 30% and a Fe contamination level less than 0.17 ppm Fe by weight, a chrome contamination level less than 00.08 ppm chrome by weight, a copper contamination level less than 0.04 ppm copper by weight, a cobalt contamination level less than 0.04 ppm cobalt by weight, an Al contamination level less than 0.9 ppm Al by weight, a nickel contamination level less than 0.04 ppm nickel by weight, a vanadium contamination level less than 0.04 ppm vanadium by weight, and a lead contamination level less than 0.04 ppm lead by weight. Preferably the Fe contamination level is less than 0.15 ppm Fe by weight, the chrome contamination level is less than 0.06 ppm chrome by weight, the copper contamination level is less than 0.02 ppm copper by weight, the cobalt contamination level is less than 0.02 ppm cobalt by weight, the Al contamination level is less than 0.7 ppm Al by weight, the nickel contamination level is less than 0.02 ppm nickel by weight, the vanadium contamination level is less than 0.02 ppm vanadium by weight, and the lead contamination level is less than 0.02 ppm lead by weight.

The invention includes magnesium fluoride crystal optics in 4 kHz lithographic, ~193 nm (centered about 193 nm) excimer lasers with the magnesium fluoride crystals suitably oriented to minimize the effects of the intrinsic birefringence of magnesium fluoride. The magnesium fluoride crystal optics 4 kHz lithographic 193 nm excimer laser provide the benefits of longer lifetime and improved performance of the optics leading to a reduced cost of ownership of the laser. FIG. 1 shows a lithographic excimer laser system in accordance with the invention with magnesium fluoride crystal laser chamber windows 20 and magnesium fluoride crystal line narrowing module beam expanding prisms 30. FIG. 2 shows an excimer laser chamber in accordance with the invention with magnesium fluoride crystal laser chamber windows 20.

Additional features and advantages of the invention will be set forth in the detailed description which follows, and in part will be readily apparent to those skilled in the art from the description or recognized by practicing the invention as described in the written description and claims hereof, as well as the appended drawings.

It is to be understood that both the foregoing general description and the following detailed description are merely exemplary of the invention, and are intended to provide an overview or framework to understanding the nature and character of the invention as it is claimed.

The accompanying drawings are included to provide a further understanding of the invention, and are incorporated in and constitute a part of this specification. The drawings illustrate one or more embodiment(s) of the invention, and together with the description serve to explain the principles and operation of the invention.

DETAILED DESCRIPTION

Figure 1:
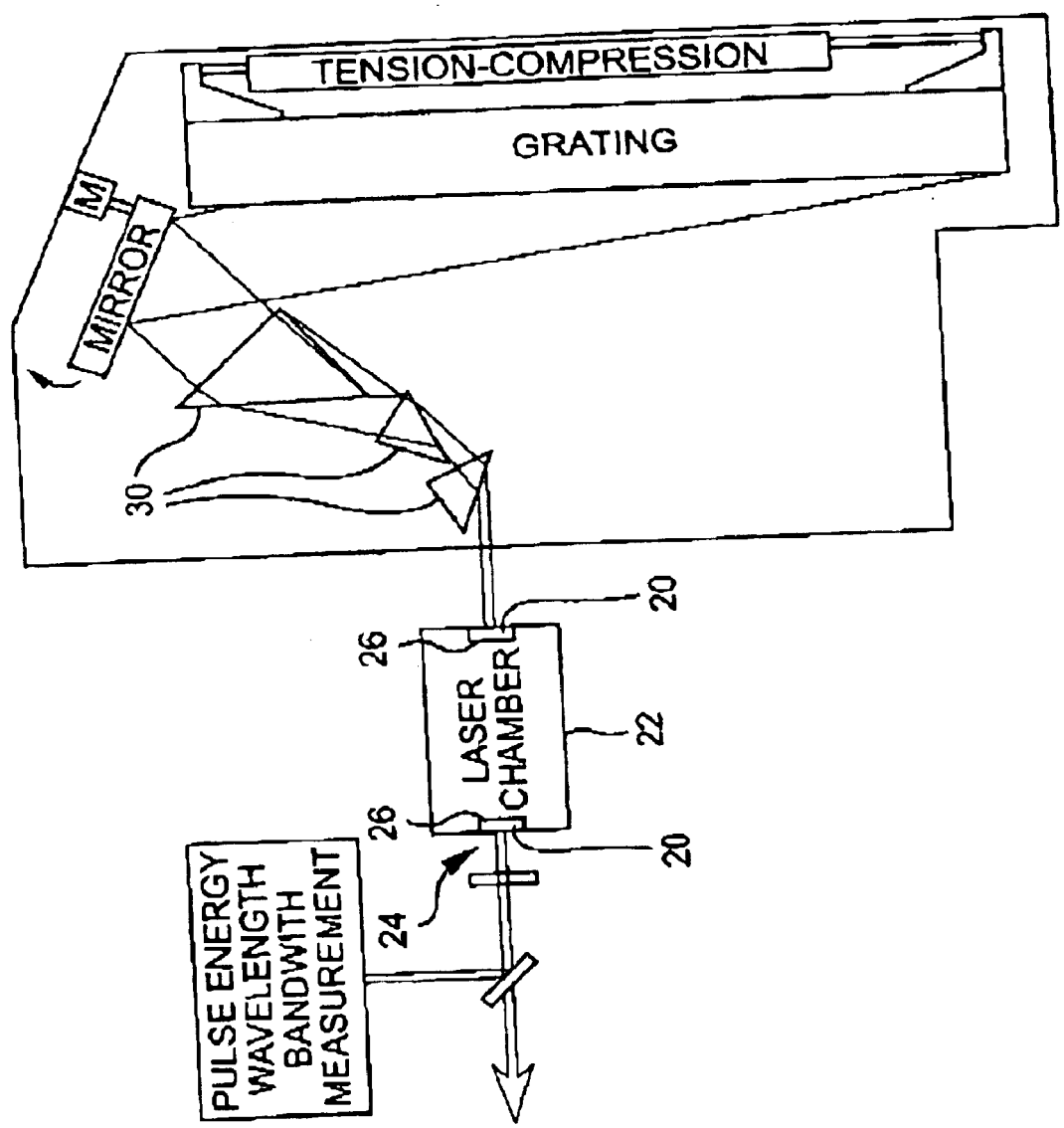
FIG. 1 show embodiment of the invention.

The invention includes a ≧4 kHz repetition rate argon fluoride excimer laser system for producing an UV wavelength 193 nm output. The high repetition rate argon fluoride (ArF) laser system utilizes at least one highly qualified magnesium fluoride excimer laser crystal optic for transmitting and controlling the 193 nm photon pulses produced at a repetition rate of at least four kilohertz. The magnesium fluoride crystal optic argon fluoride laser system provides for the production of a high laser power (≧10 mJ) output at a high repetition rate (≧4 kHz) for a long laser system operation time greater than 500 million pulses with the magnesium fluoride crystal optics resistant to damage from the high repetition rate 193 nm pulses and avoidance of catastrophic laser system failure. The ≧4 kHz repetition rate argon fluoride excimer laser system comprises an argon fluoride excimer laser chamber for producing a 193 nm discharge at a pulse repetition rate ≧4 kHz. The excimer laser chamber includes at least one magnesium fluoride crystal optic window for outputting the 193 nm discharge as a ≧4 kHz repetition rate excimer laser 193 nm output with the magnesium fluoride crystal optic window having a 255 nm induced absorption less than 0.08 Abs/42 mm when exposed to 5 million pulses of 193 nm light at a fluence ≧40 mj/cm$^2$/pulse at a repetition rate of 200 Hz and an unexposed 42 mm crystal 120 nm measured transmission of at least 30%. The unexposed 42 mm crystal 120 nm measured transmission of at least 30% is the 120 nm measured transmission of the magnesium fluoride crystal before exposure to 193 nm excimer laser light pulses. The magnesium fluoride crystal has a 120 nm measured transmission such that at least 30% of 120 nm light that impinges on a first optical surface and travels through a 42 mm length of the crystal (42 mm crystal path length transmission) is transmitted through a second opposing optical surface. Preferably the magnesium fluoride crystal optic's 42 mm crystal 120 nm measured transmission is at least 35%, more preferably at least 40% and most preferably at least 45%. Embodiments of the ≧4 kHz repetition rate argon fluoride excimer laser system are shown in FIGS. 1–2.

Figure 2:
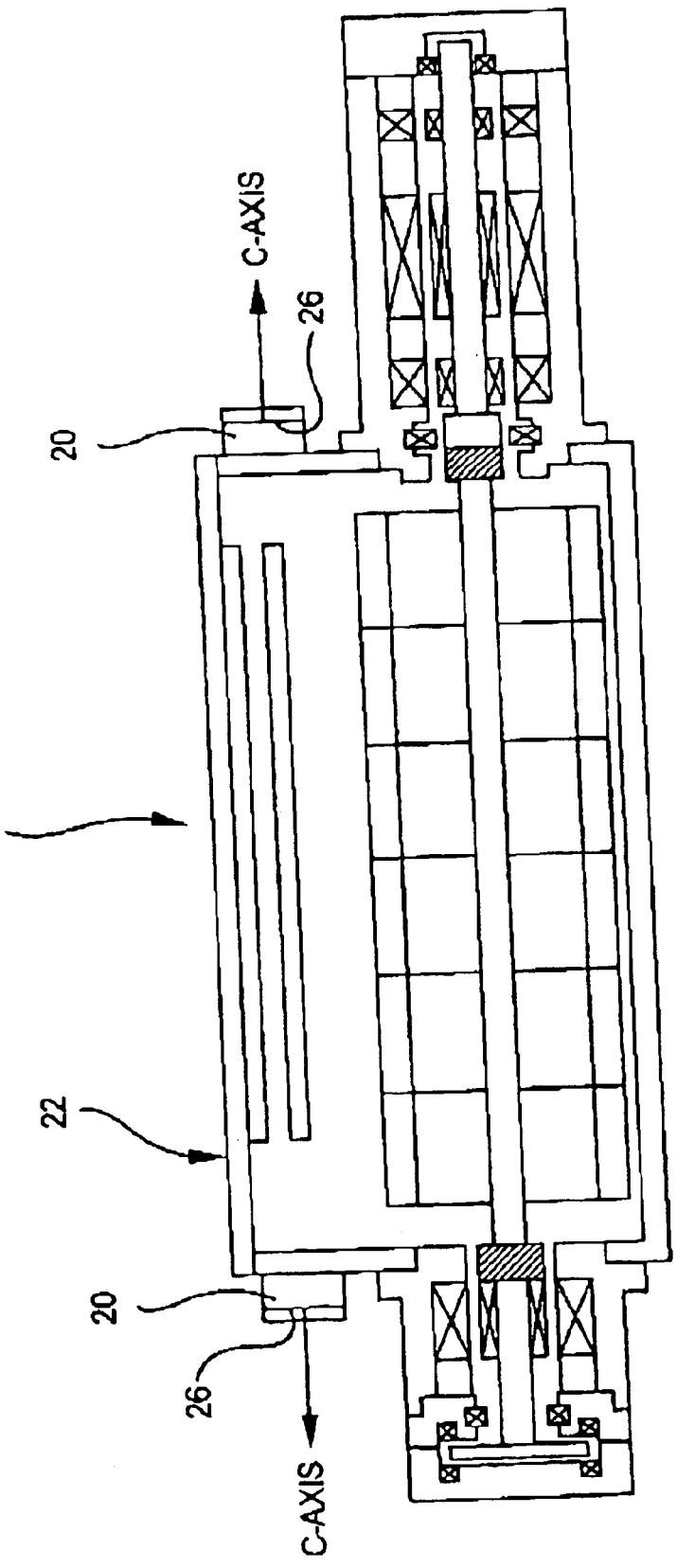
FIG. 2 show embodiment of the invention.
Figure 3:
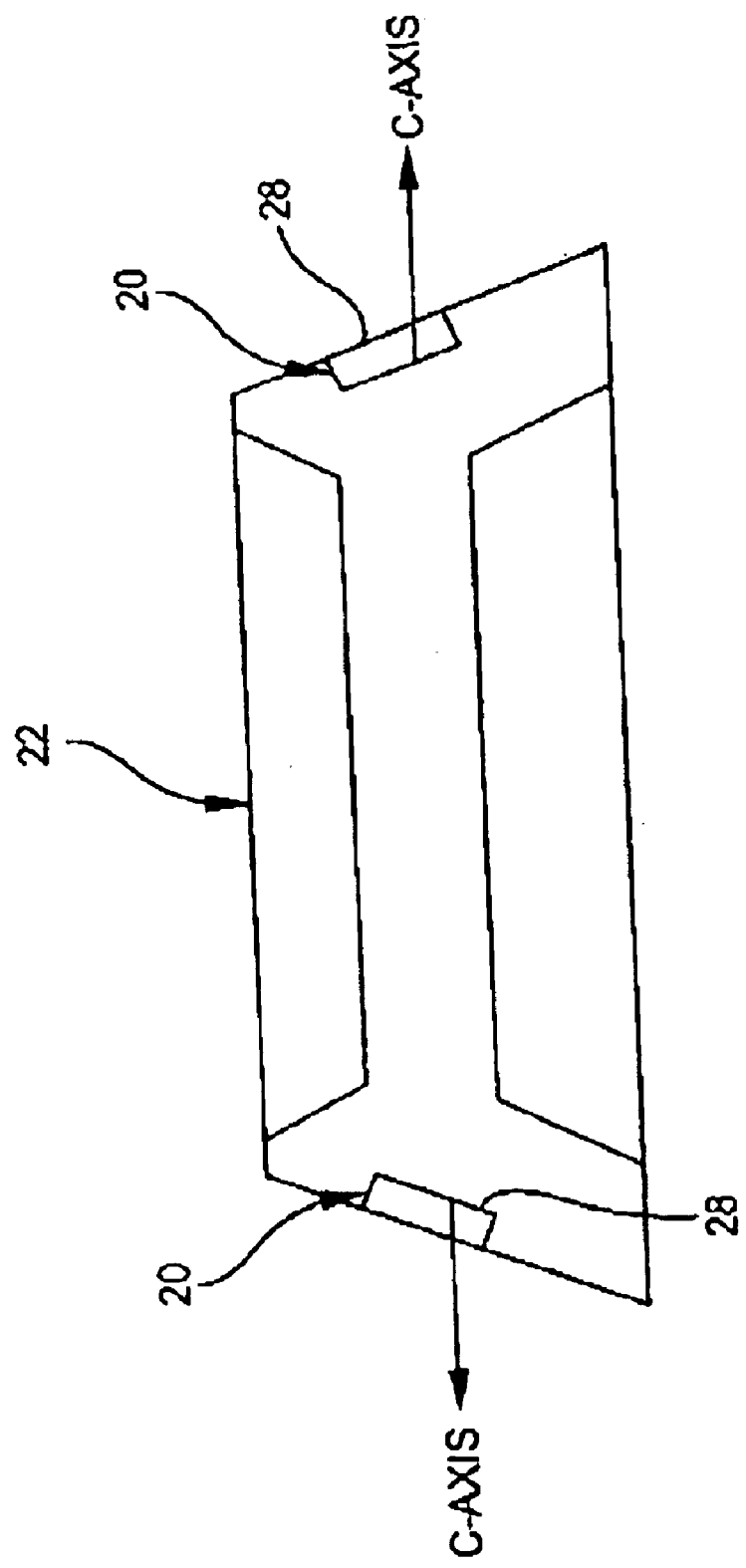
FIG. 3 show embodiment of the invention.
Figure 4:
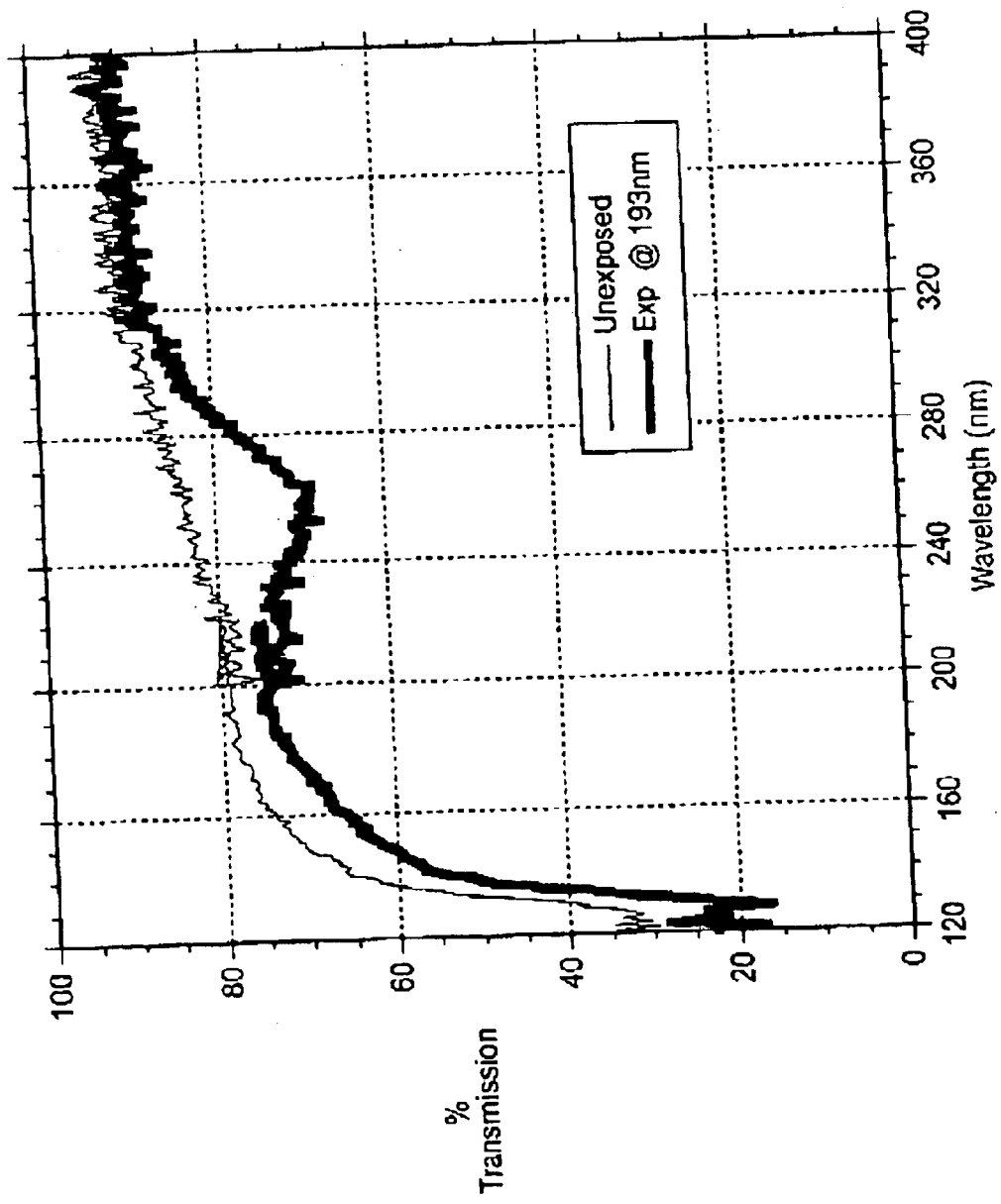
FIGS. 4–8 shows VUV/UV plots of magnesium fluoride crystals in accordance with the invention.
Figure 5:
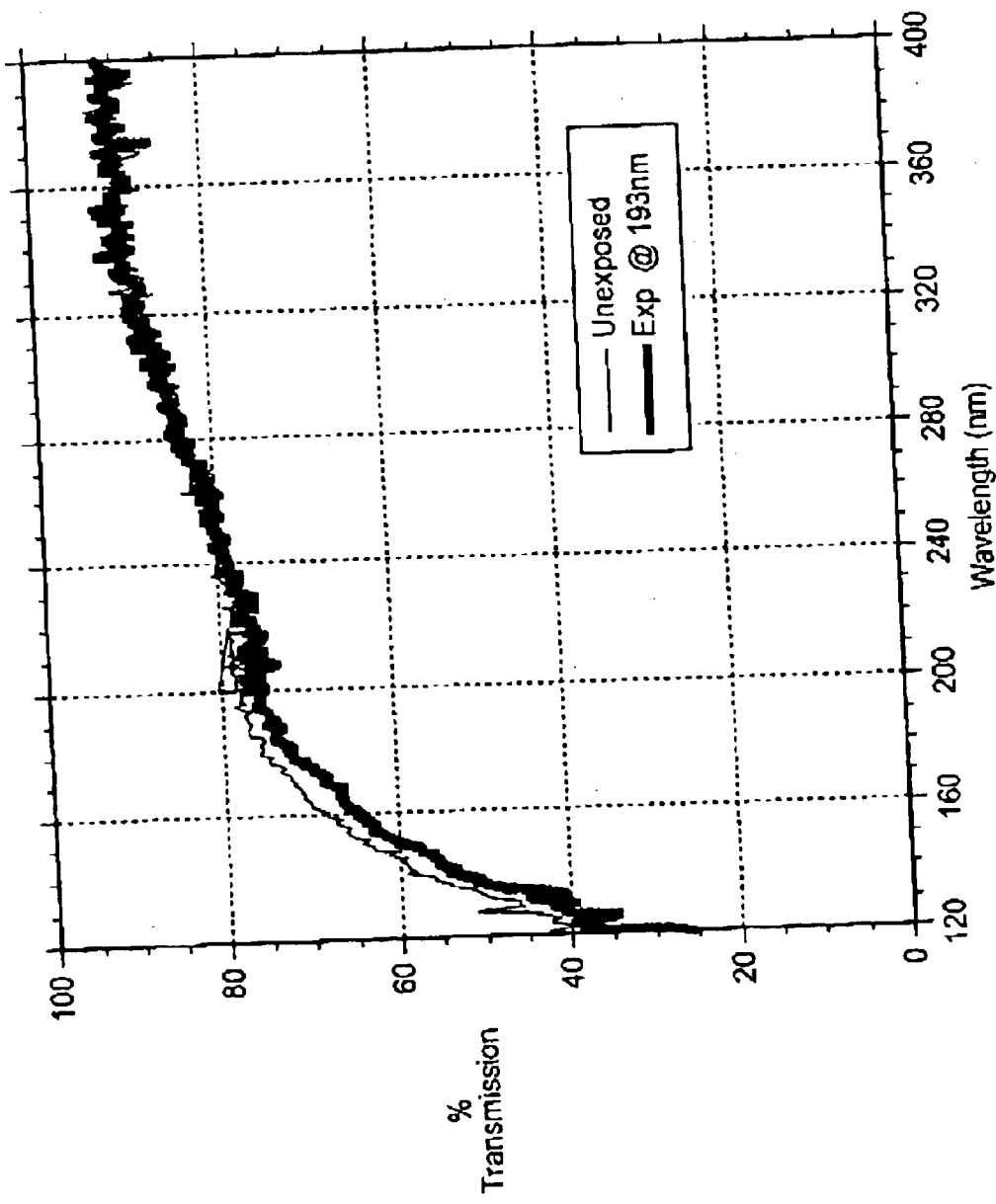
Figure 6:
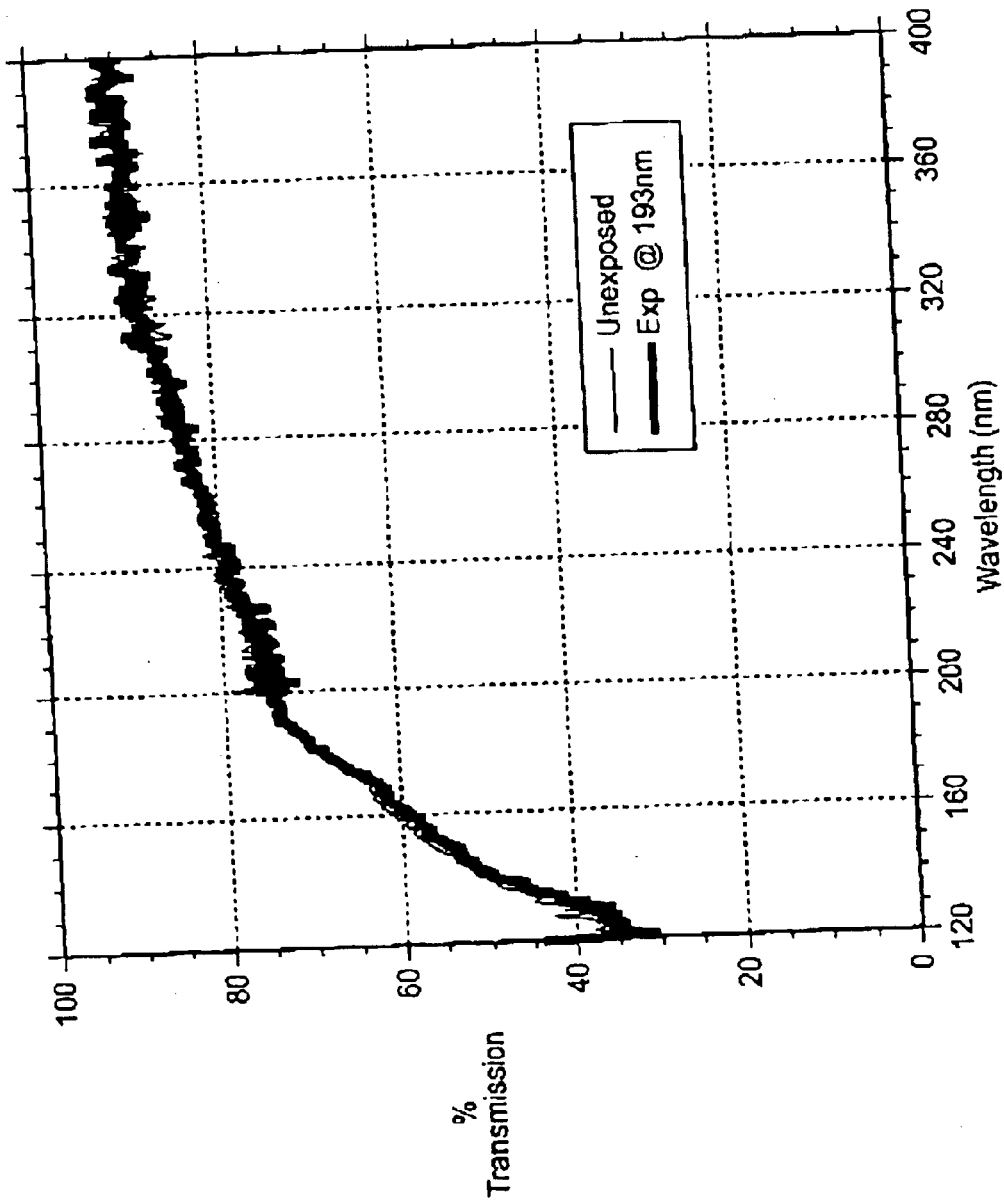
Figure 7:
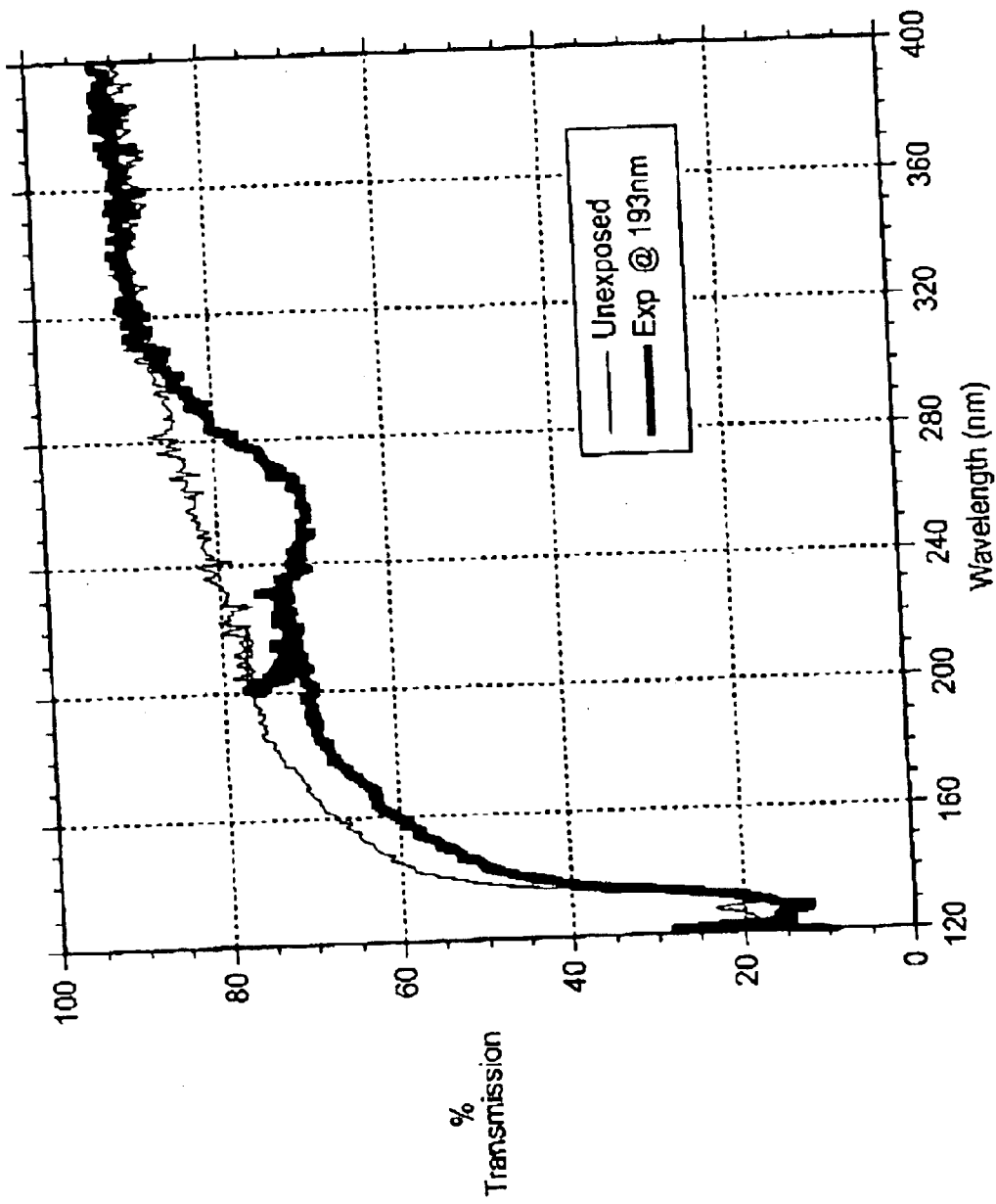
Figure 8:
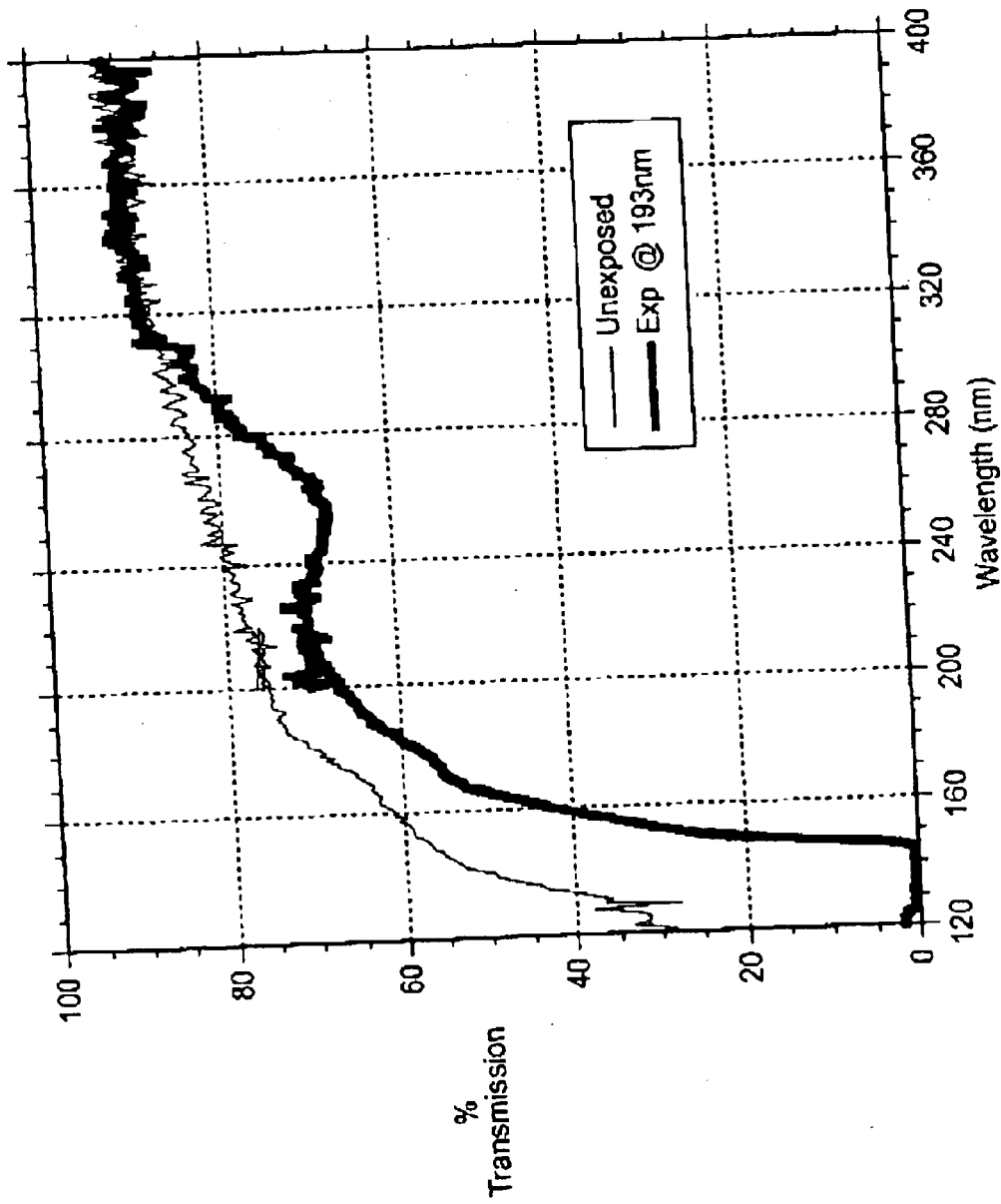

In FIG. 1, the argon fluoride excimer laser chamber 22 includes two magnesium fluoride crystal optic windows 20 for outputting the 193 nm discharge produced in laser chamber 22 at a repetition rate of at least 4 kHz. The excimer laser chamber 22 produces a ≧4 kHz repetition rate excimer laser 193 nm output 24 outputted through magnesium fluoride crystal laser chamber window 20. Magnesium fluoride crystal laser chamber windows 20 have a 255 nm induced absorption less than 0.08 Abs/42 mm when exposed to 5 million pulses of 193 nm light at a fluence ≧40 mj/cm$^2$/pulse. Magnesium fluoride crystal laser chamber windows 20 have a 42 mm crystal 120 nm transmission of at least 30%. In FIG. 2, argon fluoride excimer laser chamber 22 includes two opposing magnesium fluoride crystal laser chamber windows 20 which have a 42 mm crystal 120 nm transmission of at least 30% and a 255 nm induced absorption less than 0.08 Abs/42 mm when exposed to 5 million pulses of 193 nm light at a fluence of at least 40 mj/cm$^2$/pulse. In FIG. 3, the argon fluoride excimer laser chamber 22 includes two fluoride crystal laser chamber windows 20 which have a 42 mm crystal 120 nm transmission of at least 30% and a 255 nm induced absorption less than 0.08 Abs/42 mm when exposed to 5 million pulses of 193 nm light at a fluence of at least 40 mj/cm$^2$/pulse.

Preferably, magnesium fluoride crystal optic window 20 has a Fe contamination level less than 0.15 ppm Fe by weight. Preferably magnesium fluoride crystal optic window 20 has a chrome contamination level less than 0.06 ppm chrome by weight. Preferably magnesium fluoride crystal optic window 20 has a copper contamination level less than 0.02 ppm copper by weight. Preferably magnesium fluoride crystal optic window 20 has a cobalt contamination level less than 0.02 ppm cobalt by weight. Preferably magnesium fluoride crystal optic window 20 has a Al contamination level less than 0.7 ppm Al by weight. Preferably magnesium fluoride crystal optic window 20 has a nickel contamination level less than 0.02 ppm nickel by weight. Preferably magnesium fluoride crystal optic window 20 has a vanadium contamination level less than 0.02 ppm vanadium by weight. Preferably magnesium fluoride crystal optic window 20 has a lead contamination level less than 0.02 ppm lead by weight. Preferably the magnesium fluoride crystal optic window 20 is of high purity with low contamination levels and has a c axis grown magnesium fluoride crystallographic orientation in that the magnesium fluoride crystal is gown on a c axis oriented seed crystal. Preferably the magnesium fluoride crystal optic window 20 has a low lead contamination level with a 200 to 210 range absorption coefficient <0.0017 cm$^{-1}$, with such internal transmission absorption measurements performed through at least 1 cm of bulk crystal, more preferably at least 4 cm of bulk crystal. More preferably the magnesium fluoride crystal optic window 20 has a 203 to 207 nm range absorption coefficient less than 0.0017 cm$^{-1}$, most preferably a 205 nm absorption coefficient less than 0.0017 cm$^{-1}$.

In an embodiment of the invention, the ≧4 kHz repetition rate argon fluoride laser system includes a magnesium fluoride crystal optic prism. The magnesium fluoride crystal optic prism is external from the excimer laser chamber with the ≧4 kHz repetition rate excimer laser 193 nm output transmitted through the prism. The magnesium fluoride crystal optic prism has a 255 nm induced absorption lees than 0.08 Abs/42 mm when exposed to 5 million pulses of 193 nm light at a fluence ≧40 mj/cm$^2$ and a 42 mm crystal 120 nm transmission of at least 30%. That is, the invention includes a magnesium fluoride optical fluoride prism that when exposed to 5 million pulses of 193 nm light at a fluence ≧40 mj/cm$^2$/pulse has an induced absorption of less than 0.08 Abs per 42 mm path and a 120 nm transmission of at least 30% through a 42 mm crystal path length; and contaminants at levels as specified above in this paragraph. Preferably the 42 mm crystal path length 120 nm transmission is at least 35%, more preferably at least 40%, and most preferably at least 45%. FIG. 1 shows an embodiment with three magnesium fluoride crystal optic prisms 30 which transmit and control the 193 nm photons outputted from laser chamber 22 through magnesium fluoride crystal optic window 20. Magnesium fluoride crystal optic prisms 30 are ±4 kHz repetition rate excimer laser magnesium fluoride crystal line narrowing module beam expanding prisms which have a 255 nm induced absorption less than 0.08 Abs/42 mm when exposed to 5 million pulses at 193 nm light at a fluence ≧40 mj/cm$^2$ and a 42 mm crystal path length 120 nm transmission of at least 30%. Preferably magnesium fluoride crystal optic prisms 30 have a 200 to 210 nm range absorption coefficient <0.0017 cm$^{-1}$, more preferably a 203 to 207 nm range absorption coefficient <0.0017 cm$^{-1}$, and most preferably a 205 mn absorption coefficient <0.0017 cm$^{-1}$. Preferably the ≧4 kHz repetition rate excimer laser 193 nm output is transmitted through prisms 30 substantially parallel to a c-axis of the magnesium fluoride crystal optic prism with the 193 nm light rays substantially parallel with the magnesium fluoride crystal c axis. Preferably magnesium fluoride crystal optic prism 30 has a c-axis grown magnesium fluoride crystallographic orientation with the magnesium fluoride crystal grown on a c-axis oriented seed crystal. Preferably magnesium fluoride crystal optic prism 30 has contamination levels of a Fe contamination level less than 0.15 ppm Fe by weight, a chrome contamination level less than 0.06 ppm chrome by weight, a copper contamination level less than 0.02 ppm copper by weight, a cobalt contamination level less than 0.02 ppm cobalt by weight, an Al contamination level less than 0.7 ppm Al by weight, a nickel contamination level leis than 0.02 ppm nickel by weight, a vanadium contamination level less than 0.02 ppm vanadium by weight, and a lead contamination level less than 0.02 ppm lead by weight.

In a preferred embodiment, magnesium fluoride crystal laser chamber window 20 has a flat planar window face oriented normal to the c axis of the magnesium fluoride crystal. As shown in FIGS. 1–2, flat planar window faces 26 of chamber windows 20 are substantially normal to the magnesium fluoride crystal c axis crystallographic orientation, with the outputted 193 nm excimer laser light rays substantially parallel to the crystal c axis. In an alternatively preferred embodiment, magnesium fluoride crystal laser chamber window 20 has a flat planar window face oriented normormal to the c axis of the magnesium fluoride crystal. As shown in FIG. 3 flat planar window faces 28 of chamber windows 20 are nonnormal to the magnesium fluoride crystal c axis crystallographic orientation, with the outputted 193 nm excimer laser light rays outputted from excimer laser chamber 22 substantially parallel to the crystal c axis. In a particularly preferred embodiment, the nonnormal oriented flat planar window face 28 forms an angle of about 560 (560±20) with the c axis of the crystal.

The invention includes a $\geq 4$ kHz repetition rate fluoride excimer laser system for producing an UV wavelength $\lambda < 200$ nm output. The $\geq 4$ kHz repetition rate fluoride excimer laser system for producing a $\lambda < 200$ nm output includes an excimer laser chamber 22. The excimer laser chamber 22 produces a UV wavelength $\lambda < 200$ nm discharge 24 at a pulse repetition rate $\geq 4$ kHz and includes at least one magnesium fluoride crystal optic window 20 for outputting the $\lambda < 200$ nm discharge as a $\geq 4$ kHz repetition rate excimer laser $\lambda < 200$ nm output. The magnesium fluoride crystal optic window 20 has a 255 nm induced absorption less than 0.08 Abs/42 mm when exposed to 5 million pulses of 193 nm light at a fluence $\geq 40$ mj/cm$^2$ and a 42 mm crystal 120 nm transmission of at least 30% and a 200 to 210 nm range absorption coefficient <0.0017 cm$^{-1}$. Preferably the 42 mm crystal 120 nm transmission crystal is at least 35%, and more preferably at least 40%. In a preferred embodiment $\lambda$ is centered about 193 nm. Preferably magnesium fluoride crystal optic window 20 has a Fe contamination level less than 0.15 ppm Fe by weight, a chrome contamination level less than 0.06 ppm chrome by weight, a copper contamination level less than 0.02 ppm copper by weight, a cobalt contamination level less than 0.02 ppm cobalt by weight, an Al contamination level less than 0.7 ppm Al by weight, a nickel contamination level less than 0.02 ppm nickel by weight, a vanadium contamination level less than 0.02 ppm vanadium by weight, and a lead contamination level less than 0.02 ppm lead by weight. Preferably magnesium fluoride crystal optic window 20 has a 203 to 207 nm range absorption coefficient <0.0017 cm$^{-1}$. Preferably the 203 to 207 nm range absorption coefficient is measured through at least 1 cm of crystal, and more preferably at least 4 cm of crystal. Preferably magnesium fluoride crystal optic window 20 has a 205 nm absorption coefficient <0.0017 cm$^{-1}$.

Preferably the $\geq 4$ kHz repetition rate fluoride excimer laser system for producing an UV wavelength $\lambda < 200$ nm output includes a magnesium fluoride crystal optic prism 30 external from the excimer laser chamber 22 wherein the $\geq 4$ kHz repetition rate excimer laser $\lambda < 200$ nm output is transmitted through the magnesium fluoride crystal optic prism 30 with the prism 30 having a 255 nm induced absorption less than 0.08 Abs/42 mm when exposed to 5 million pulses of 193 nm light at a fluence $\geq 40$ mj/cm$^2$ and a 42 mm crystal 120 nm transmission of at least 30%. Preferably magnesium fluoride crystal optic prism 30 has a 42 mm crystal 120 nm transmission of at least 35% and more preferably at least 40%. Preferably the magnesium fluoride crystal optic prism 30 has a 200 to 210 nm range absorption coefficient <0.0017 cm$^{-1}$ through at least 1 cm of crystal and more preferably through at least 4 cm of crystal. Preferably the prism 30 has a 203 to 207 nm range absorption coefficient <0.0017 cm$^{-1}$ and more preferably a 205 nm absorption coefficient <0.0017 cm$^{-1}$.

The invention includes a $\geq 4$ kHz repetition rate fluoride excimer laser crystal optic for transmitting a $\geq 4$ kHz repetition rate fluoride excimer UV wavelength $\lambda < 200$ nm output. The $\geq 4$ kHz repetition rate <200 fluoride excimer laser crystal optic is comprised of a magnesium fluoride crystal with a 255 nm induced absorption less than 0.08 Abs/42 mm when exposed to 5 million pulses of 193 nm light at a fluence $\geq 40$ mj/cm$^2$ and has a 42 mm crystal 120 nm transmission of at least 30%. Preferably $\lambda$ is centered about 193 nm. Preferably the $\geq 4$ kHz repetition rate fluoride excimer laser crystal optic has a 42 mm crystal 120 nm transmission of at least 35%, more preferably at least 40% and most preferably at least 45%. Preferably the $\geq 4$ kHz repetition rate fluoride excimer laser crystal optic has a Fe contamination level less than 0.15 ppm Fe by weight. Preferably the $\geq 4$ kHz repetition rate fluoride excimer laser crystal optic has a chrome contamination level less than 0.06 ppm chrome by weight. Preferably the $\geq 4$ kHz repetition rate fluoride excimer laser crystal optic has a copper contamination level less than 0.02 ppm copper by weight. Preferably the $\geq 4$ kHz repetition rate fluoride excimer laser crystal optic has a cobalt contamination level less than 0.02 ppm cobalt by weight. Preferably the $\geq 4$ kHz repetition rate fluoride excimer laser crystal optic has a Al contamination level less than 0.7 ppm Al by weight. Preferably the $\geq 4$ kHz repetition rate fluoride excimer laser crystal optic has a nickel contamination level less than 0.02 ppm nickel by weight. Preferably the $\geq 4$ kHz repetition rate fluoride excimer laser crystal optic has a vanadium contamination level less than 0.02 ppm vanadium by weight. Preferably the $\geq 4$ kHz repetition rate fluoride excimer laser crystal optic has a lead contamination level less than 0.02 ppm lead by weight. Preferably the $\geq 4$ kHz repetition rate fluoride excimer laser magnesium fluoride crystal optic has a c axis grown magnesium fluoride crystallographic orientation with the magnesium fluoride crystal grown on a c axis oriented seed crystal. In an embodiment the $\geq 4$ kHz repetition rate fluoride excimer laser magnesium fluoride crystal optic has a flat planar window face oriented normal to a c axis of the magnesium fluoride crystal with outputted <200 nm light rays substantially parallel to the crystal c axis. In an alternative embodiment the $\geq 4$ kHz repetition rate fluoride excimer laser magnesium fluoride crystal optic has a flat planar face oriented nonnormal to a c axis of the magnesium fluoride crystal with outputted <200 nm light rays substantially parallel to the crystal c axis. Preferably the $\geq 4$ kHz repetition rate fluoride excimer laser crystal optic magnesium fluoride has a 200 to 210 nm range absorption coefficient <0.0017 cm$^{-1}$ measured through at least 1 cm of crystal, and more preferably at least 4 cm of crystal. More preferably magnesium fluoride $\geq 4$ kHz repetition rate laser optic has a 203 to 207 nm range absorption coefficient <0.0017 cm$^{-1}$, and more preferred a 205 nm absorption coefficient <0.0017 cm$^{-1}$.

The invention includes a $\geq 4$ kHz repetition rate fluoride excimer laser crystal optic window for transmitting a $\geq 4$ kHz repetition rate fluoride excimer UV wavelength $\lambda < 200$ nm output comprised of a magnesium fluoride crystal with a 255 nm induced absorption less than 0.08 Abs/42 mm when exposed to 5 million pulses of 193 nm light at a fluence $\geq 40$ mj/cm$^2$ and a 42 mm crystal 120 nm transmission of at least 30% and a 200 to 210 nm absorption coefficient <0.0017 cm$^{-1}$. In an embodiment $\lambda$ is centered about 193 nm. In an embodiment $\lambda$ is centered about 157 nm. Preferably the $\geq 4$ kHz repetition rate magnesium fluoride crystal optic window has a 42 mm crystal 120 nm transmission of at least 35%, and more preferably at least 40%. Preferably the ≧4 kHz repetition rate magnesium fluoride crystal optic window has a 200 to 210 nm range absorption coefficient <0.0017 cm$^{-1}$ through at least 1 cm of crystal, more preferably through at least 4 cm of crystal. More preferably the optic window has a 203 to 207 nm range absorption coefficient <0.0017 cm$^1$, most preferably a 205 nm absorption coefficient <0.0017 cm$^1$. Preferably magnesium fluoride crystal optic window has contamination levels of a Fe contamination level less than 0.15 ppm Fe by weight, a chrome contamination level less than 0.06 ppm chrome by weight, a copper contamination level less than 0.02 ppm copper by weight, a cobalt contamination level less than 0.02 ppm cobalt by weight, an Al contamination level less than 0.7 ppm Al by weight, a nickel contamination level less than 0.02 ppm nickel by weight, a vanadium contamination level less than 0.02 ppm vanadium by weight, and a lead contamination level less than 0.02 ppm lead by weight.

The invention includes a ≧4 kHz repetition rate argon fluoride excimer laser crystal optic for transmitting an UV wavelength 193 nm argon fluoride excimer laser ≧4 kHz repetition rate output with the laser crystal optic comprised of a magnesium fluoride crystal with a 255 nm induced absorption less than 0.08 Abs/42 mm when exposed to 5 million pulses of 193 nm light at a fluence ≧40 mj/cm$^2$/pulse and a 42 mm crystal 120 nm transmission of at least 30%. Preferably the magnesium fluoride has a 200 to 210 nm range absorption coefficient <0.0017 cm$^{-1}$, measured through at least 1 cm of crystal, and more preferably at least 4 cm of crystal. More preferably the magnesium fluoride has a 203 to 207 nm range absorption coefficient <0.0017 cm$^{-1}$, and more preferred a 205 nm absorption coefficient <0.0017 cm$^{-1}$. Preferably magnesium fluoride crystal has contamination levels of a Fe contamination level less than 0.15 ppm Fe by weight, a chrome contamination level less than 0.06 ppm chrome by weight, a copper contamination level less than 0.02 ppm copper by weight, a cobalt contamination level less than 0.02 ppm cobalt by weight, an Al contamination level less than 0.7 ppm Al by weight, a nickel contamination level less than 0.02 ppm nickel by weight, a vanadium contamination level less than 0.02 ppm vanadium by weight, and a lead contamination level less than 0.02 ppm lead by weight.

The invention includes a λ<200 nm optical fluoride crystal for transmitting a UV wavelength λ<200 nm with the λ<200 nm optical fluoride crystal comprised of a magnesium fluoride crystal with a 255 nm induced absorption less than 0.08 Abs/42 mm when exposed to 5 million pulses of 193 nm light at a fluence ≧40 mj/cm$^2$/pulse and a 42 mm crystal 120 nm transmission of at least 30% and a Fe contamination level less than 0.17 ppm Fe by weight, a chrome contamination level less than 00.08 ppm chrome by weight, a copper contamination level less than 0.04 ppm copper by weight, a cobalt contamination level less than 0.04 ppm cobalt by weight, an Al contamination level less than 0.9 ppm Al by weight, a nickel contamination level less than 0.04 ppm nickel by weight, a vanadium contamination level less than 0.04 ppm vanadium by weight, and a lead contamination level less than 0.04 ppm lead by weight and a 200 to 210 nm range absorption coefficient <0.0017 cm$^1$. Preferably the Fe contamination level is less than 0.15 ppm Fe by weight, the chrome contamination level is less than 0.06 ppm chrome by weight, the copper contamination level is less than 0.02 ppm copper by weight, the cobalt contamination level is less than 0.02 ppm cobalt by weight, the Al contamination level is less than 0.7 ppm Al by weight, the nickel contamination level is less than 0.02 ppm nickel by weight, the vanadium contamination level is less than 0.02 ppm vanadium by weight, and the lead contamination level is less than 0.02 ppm lead by weight. More preferably the magnesium fluoride has a 203 to 207 nm range absorption coefficient <0.0017 cm$^1$, and more preferred a 205 nm absorption coefficient <0.0017 cm$^{-1}$.

The invention includes a ≧4 kHz repetition rate argon fluoride excimer laser crystal for transmitting an UV wavelength 193 nm argon fluoride excimer laser ≧4 kHz repetition rate output with the laser crystal comprised a magnesium fluoride crystal with a 255 nm induced absorption less than 0.08 Abs/42 mm when exposed to 5 million pulses of 193 nm light at a fluence ≧40 mj/cm$^2$/pulse and a 42 mm crystal 120 nm transmission of at least 30% and a Fe contamination level less than 0.17 ppm Fe by weight, a chrome contamination level less than 00.08 ppm chrome by weight, a copper contamination level less than 0.04 ppm copper by weight, a cobalt contamination level less than 0.04 ppm cobalt by weight, an Al contamination level less, than 0.9 ppm Al by weight, a nickel contamination level less than 0.04 ppm nickel by weight, a vanadium contamination level less than 0.04 ppm vanadium by weight, and a lead contamination level less than 0.04 ppm lead by weight. Preferably the Fe contamination level is less than 0.15 ppm Fe by weight, the chrome contamination level is less than 0.06 ppm chrome by weight, the copper contamination level is less than 0.02 ppm copper by weight, the cobalt contamination level is less than 0.02 ppm cobalt by weight, the Al contamination level is less than 0.7 ppm Al by weight, the nickel contamination level is less than 0.02 ppm nickel by weight, the vanadium contamination level is less than 0.02 ppm vanadium by weight, and the lead contamination level is less than 0.02 ppm lead by weight. Preferably the magnesium fluoride has a 200 to 210 nm range absorption coefficient <0.0017 cm$^{-1}$ measured through at least 1 cm of crystal, and more preferably at least 4 cm of crystal. More preferably the magnesium fluoride has a 203 to 207 nm range absorption coefficient <0.0017 cm$^{-1}$, and more preferred a 205 nm absorption coefficient <0.0017 cm$^{-1}$.

Magnesium Fluoride Crystal Chemical Analysis of contaminants (ppm by weight)

| Element | |
|---|---|
| Ag | <0.02 |
| Al | 0.6448 |
| As | <0.1 |
| Au | <0.02 |
| Ba | 0.1811 |
| Be | <0.02 |
| Bi | <0.02 |
| Ca | <1 |
| Cd | <0.02 |
| Ce | <0.02 |
| Co | <0.02 |
| Cr | 0.0536 |
| Cs | <0.02 |
| Cu | <0.02 |
| Dy | <0.02 |
| Er | <0.02 |
| Eu | <0.02 |
| Fe | 0.1429 |
| Ga | <0.1 |
| Gd | <0.02 |
| Ge | <0.1 |
| Hf | <0.02 |
| Hg | <0.02 |
| Ho | <0.02 |
| In | <0.02 |
| Ir | <0.02 |

-continued

| Element | |
|---|---|
| K | <0.1 |
| La | <0.02 |
| Li | <0.02 |
| Lu | <0.02 |
| Mn | 0.0171 |
| Mo | <0.02 |
| Na | <0.1 |
| Nb | 0.0317 |
| Nd | <0.02 |
| Ni | <0.02 |
| Os | <0.02 |
| P | <0.1 |
| Pb | 0.0151 |
| Pd | <0.02 |
| Pr | <0.02 |
| Pt | <0.02 |
| Rb | <0.02 |
| Re | <0.02 |
| Rh | <0.02 |
| Ru | <0.02 |
| Sb | <0.02 |
| Sc | <0.02 |
| Se | <0.02 |
| Sm | <0.02 |
| Sn | <0.02 |
| Sr | 0.0193 |
| Ta | 0.4234 |
| Tb | <0.02 |
| Te | <0.02 |
| Th | <0.02 |
| Ti | <0.1 |
| Tl | <0.02 |
| Tm | <0.02 |
| U | <0.02 |
| V | <0.02 |
| W | <0.02 |
| Y | <0.02 |
| Yb | <0.02 |
| Zn | 0.0969 |
| Zr | <0.1 |

Preferably the lead contamination level is ≦0.015 ppm by weight. Preferably the aluminum contamination level is ≦0.65 ppm by weight. Preferably the iron contamination level is ≦0.143 ppm by weight.

It will be apparent to those skilled in the art that various modifications and variations can be made to the present invention without departing from the spirit or scope of the invention. Thus, it is intended that the present invention cover the modifications and variations of this invention provided they come within the scope of the appended claims and their equivalents.

What is claimed is:

1. A ≧4 kHz repetition rate fluoride excimer laser system for producing an UV output of wavelength λ<200 nm, said laser system comprising:
   an excimer laser chamber for producing an UV wavelength λ<200 nm discharge at a pulse repetition rate ≧4 kHz, and said chamber having at least one window made from a magnesium fluoride single crystal,
   for outputting said λ<200 nm discharge as a ≧4 kHz repetition rate excimer laser λ<200 nm output;
   wherein said magnesium fluoride window, when exposed to 5 million pulses of 193 nm light at a fluence ≧40 mJ/cm$^2$/pulse, has an induced absorption of less than 0.08 Abs per 42 mm path length when measured at 255 nm, a 120 nm transmission of at least 30% through said 42 mm path length, and a 200 to 210 nm range absorption coefficient 0.0017 cm$^{-1}$.

2. The laser system as claimed in claim 1, wherein said crystal has a 120 nm transmission is at least 40% through said 42 mm path length.

3. The laser system as claimed in claim 1, wherein said magnesium fluoride crystal optic window and/or prism has, by weight, an Fe contamination level less than 0.15 ppm, a Cr contamination level less than 0.08 ppm, a Cu contamination level less than 0.04 ppm, a Co contamination level less than 0.04 ppm, an A; contamination level less than 0.9 ppm, a Ni contamination level less than 0.4 ppm, a V contamination level less than 0.04 ppm, and a Pb contamination level less than 0.04 ppm.

4. The laser system as claimed in claim 1, wherein said laser system further comprises:
   a magnesium fluoride crystal optic prism, said prism being external from said excimer laser chamber to transmit and control light outputted from said chamber for transmission and control,
   wherein said ≧4 kHz repetition rate, λ<200 nm output from said chamber is transmitted through said prism and, when exposed to 5 million pulses of 193 nm light at a fluence of <40 mJ/cm$^2$/pulse, said magnesium fluoride prism has an induced absorption less than 0.08 Abs per 42 mm path when measured at 255 nm and a 120 nm transmission of at least 30% through a 42 mm path.

5. The laser system as claimed in claim 4, wherein said magnesium fluoride prism has an 200 to 210 nm range absorption coefficient <0.0017 cm$^{-1}$.

6. The laser system according to claim 1, wherein said laser system is an argon fluoride laser system.

7. An excimer laser crystal optic for transmitting a ≧4 kHz repetition rate fluoride excimer UV wavelength λ<200 nm output, said laser crystal optic comprising:
   a magnesium fluoride crystal optic which, when exposed to 5 million pulses of 193 nm light at a fluence <40 mJ/cm$^2$/pulse, has an induced absorption of less than 0.08 Abs per 42 mm path, a 120 nm transmission of at least 30% and a 200 to 210 nm range absorption coefficient of <0.0017 cm$^{-1}$.

8. The ≧4 kHz repetition rate fluoride excimer laser crystal optic as claimed in claim 7, wherein λ is centered about 193 nm.

9. The ≧4 kHz repetition rate fluoride excimer laser crystal optic as claimed in 7 wherein said magnesium fluoride crystal has, by weight, an Fe contamination level less than 0.15 ppm, a Cr contamination level less than 0.06 ppm, a Cu contamination level less than 0.02 ppm, a Co contamination level less than 0.02 ppm, an Al contamination level less than 0.7 ppm, a Ni contamination level less than 0.2 ppm, a V contamination level less than 0.02 ppm, and a Pb contamination level less than 0.02 ppm.

10. The excimer laser crystal optic as claimed in 7, wherein said magnesium fluoride crystal optic has a flat planar face oriented normal to a c-axis of said magnesium fluoride crystal.

11. The excimer laser crystal optic as claimed in 7, wherein said magnesium fluoride crystal optic has a flat planar face oriented non-normal to c-axis of said magnesium fluoride crystal.

12. The excimer laser crystal optic as claimed in 7, wherein said magnesium fluoride crystal has a c-axis grown magnesium fluoride crystallographic orientation.

13. The excimer laser optic as claimed in claim 7, wherein said optic is in the form of a laser window or prism.

* * * * *